(12) United States Patent
Hahm et al.

(10) Patent No.: US 7,684,779 B2
(45) Date of Patent: *Mar. 23, 2010

(54) WIRELESS TERMINAL BASEBAND PROCESSOR HIGH SPEED TURBO DECODING MODULE

(75) Inventors: Mark David Hahm, Hartland, WI (US); Li Fung Chang, Holmdel, NJ (US)

(73) Assignee: Broadcom Corporation, Irvine, CA (US)

( * ) Notice: Subject to any disclaimer, the term of this patent is extended or adjusted under 35 U.S.C. 154(b) by 1291 days.

This patent is subject to a terminal disclaimer.

(21) Appl. No.: 11/141,478

(22) Filed: May 31, 2005

(65) Prior Publication Data
US 2006/0270369 A1    Nov. 30, 2006

(51) Int. Cl.
*H04B 1/26*    (2006.01)
(52) U.S. Cl. .................. 455/324; 455/334; 370/442; 375/265; 714/792
(58) Field of Classification Search ............. 455/313, 455/323, 324, 333, 334; 370/329, 335, 441, 370/442, 468, 479; 375/262, 265, 340, 341, 375/346, 348; 714/786, 792, 794, 795
See application file for complete search history.

(56) References Cited
U.S. PATENT DOCUMENTS
2003/0177432 A1*  9/2003  Yamamoto et al. ......... 714/755
2004/0190552 A1*  9/2004  Kim et al. ................. 370/469
2004/0225949 A1* 11/2004  Coombs et al. ............ 714/796
2006/0268929 A1* 11/2006  Lai et al. .................. 370/465
2006/0274715 A1* 12/2006  Hahm et al. ............... 370/349

* cited by examiner

*Primary Examiner*—Duc Nguyen
*Assistant Examiner*—Nhan T Le
(74) *Attorney, Agent, or Firm*—Garlick Harrison & Markison; Bruce E. Garlick; Holly L. Rudnick

(57) ABSTRACT

A baseband processing module for use within a Radio Frequency (RF) transceiver includes a downlink/uplink interface, TX processing components, a processor, memory, RX processing components, and a turbo decoding module. The RX processing components receive a baseband RX signal from the RF front end, produce a set of IR samples from the baseband RX signal, and transfer the set of IR samples to the memory. The turbo decoding module receives a set of IR samples from the memory, forms a turbo code word from the set of IR samples, turbo decodes the turbo code word to produce inbound data, and outputs the inbound data to the downlink/uplink interface. The turbo decoding module performs metric normalization based upon a chosen metric, performs de-rate matching on the set of IR samples, performs error detection operations, and extracts information from a MAC packet that it produces.

16 Claims, 14 Drawing Sheets

WIRELESS TERMINAL BASEBAND PROCESSOR HIGH SPEED TURBO DECODING MODULE

BACKGROUND

1. Technical Field

The present invention relates generally to wireless communication systems; and more particularly to the receipt of data communications by a wireless terminal in such a wireless communication system.

2. Related Art

Cellular wireless communication systems support wireless communication services in many populated areas of the world. Cellular wireless communication systems include a "network infrastructure" that wirelessly communicates with wireless terminals within a respective service coverage area. The network infrastructure typically includes a plurality of base stations dispersed throughout the service coverage area, each of which supports wireless communications within a respective cell (or set of sectors). The base stations couple to base station controllers (BSCs), with each BSC serving a plurality of base stations. Each BSC couples to a mobile switching center (MSC). Each BSC also typically directly or indirectly couples to the Internet.

In operation, each base station communicates with a plurality of wireless terminals operating in its serviced cell/sectors. A BSC coupled to the base station routes voice communications between the MSC and the serving base station. The MSC routes the voice communication to another MSC or to the PSTN. BSCs route data communications between a servicing base station and a packet data network that may include or couple to the Internet. Transmissions from base stations to wireless terminals are referred to as "forward link" transmissions while transmissions from wireless terminals to base stations are referred to as "reverse link" transmissions. The volume of data transmitted on the forward link typically exceeds the volume of data transmitted on the reverse link. Such is the case because data users typically issue commands to request data from data sources, e.g., web servers, and the web servers provide the data to the wireless terminals.

Wireless links between base stations and their serviced wireless terminals typically operate according to one (or more) of a plurality of operating standards. These operating standards define the manner in which the wireless link may be allocated, setup, serviced, and torn down. Popular currently employed cellular standards include the Global System for Mobile telecommunications (GSM) standards, the North American Code Division Multiple Access (CDMA) standards, and the North American Time Division Multiple Access (TDMA) standards, among others. These operating standards support both voice communications and data communications. More recently introduced operating standards include the Universal Mobile Telecommunications Services (UMTS)/Wideband CDMA (WCDMA) standards. The UMTS/WCDMA standards employ CDMA principles and support high throughput, both voice and data. As contrasted to the North American CDMA standards, transmissions within a UMTS/WCDMA system are not aligned to a timing reference, i.e., GPS timing reference. Thus, synchronization to a base station by a wireless terminal is more complicated in a WCDMA system than in a North American CDMA system. Further, in order to support a high throughput, coding operations of the UMTS/WCDMA system are fairly complicated. Thus, a need exists for improvements in decoding operations of a supported wireless terminal.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE DRAWINGS

Figure 1:
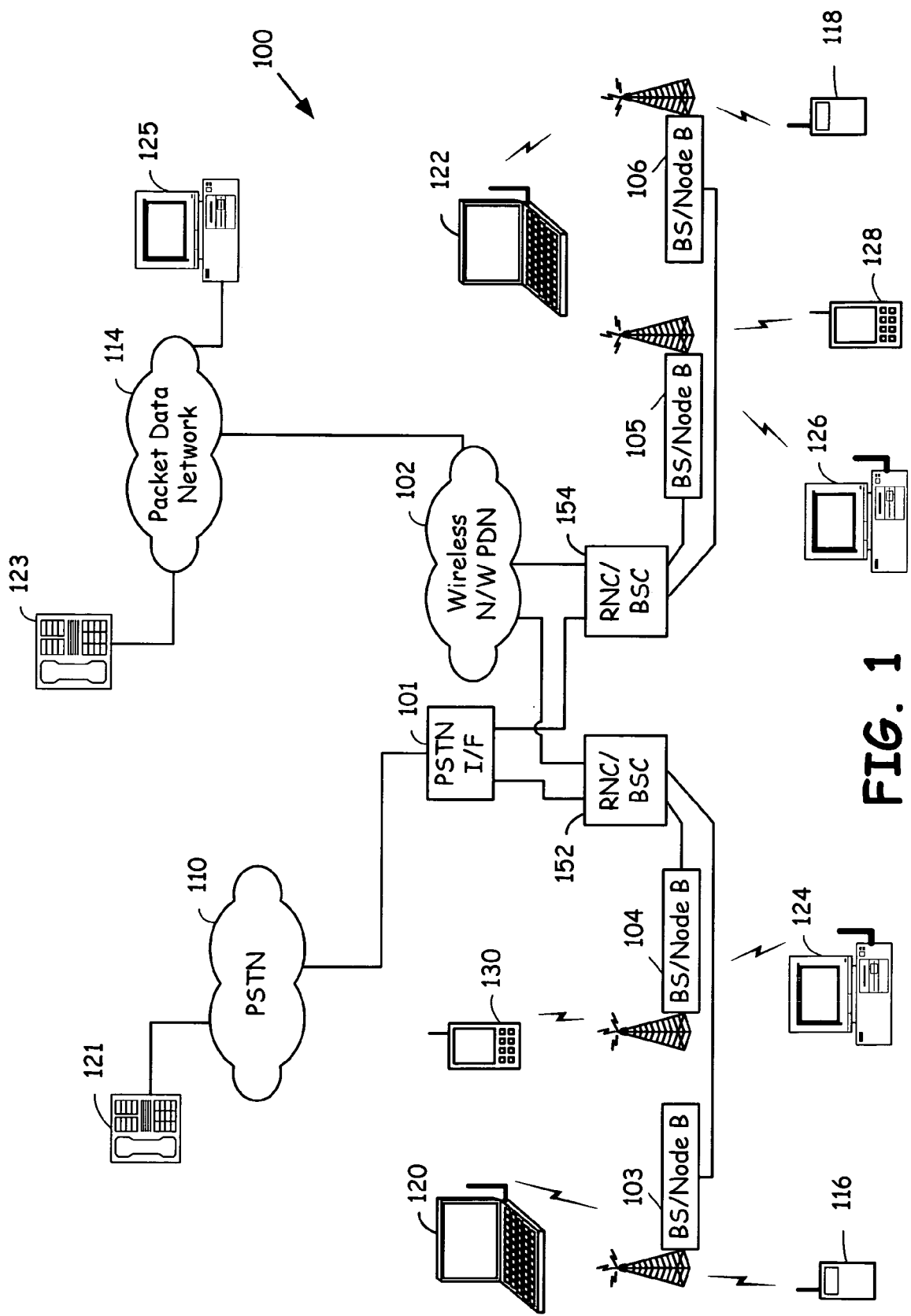
FIG. 1 is a system diagram illustrating a portion of a cellular wireless communication system that supports wireless terminals operating according to the present invention.

FIG. 1 is a system diagram illustrating a portion of a cellular wireless communication system 100 that supports wireless terminals operating according to the present invention. The cellular wireless communication system 100 includes a Public Switched Telephone Network (PSTN) Interface 101, e.g., Mobile Switching Center, a wireless network packet data network 102 that includes GPRS Support Nodes, EDGE Support Nodes, WCDMA Support Nodes, and other components, Radio Network Controllers/Base Station Controllers (RNC/BSCs) 152 and 154, and base stations/node Bs 103, 104, 105, and 106. The wireless network packet data network 102 couples to additional private and public packet data networks 114, e.g., the Internet, WANs, LANs, etc. A conventional voice terminal 121 couples to the PSTN 110. A Voice over Internet Protocol (VoIP) terminal 123 and a personal computer 125 couple to the Internet/WAN 114. The PSTN Interface 101 couples to the PSTN 110. Of course, this particular structure may vary from system to system.

Each of the base stations/node Bs 103-106 services a cell/set of sectors within which it supports wireless communications. Wireless links that include both forward link components and reverse link components support wireless communications between the base stations and their serviced wireless terminals. These wireless links support digital data communications, VoIP communications, and other digital multimedia communications. The cellular wireless communication system 100 may also be backward compatible in supporting analog operations as well. The cellular wireless communication system 100 supports one or more of the UMTS/WCDMA standards, the Global System for Mobile telecommunications (GSM) standards, the GSM General Packet Radio Service (GPRS) extension to GSM, the Enhanced Data rates for GSM (or Global) Evolution (EDGE) standards, and/or various other CDMA standards, TDMA standards and/or FDMA standards, etc.

Wireless terminals 116, 118, 120, 122, 124, 126, 128, and 130 couple to the cellular wireless communication system 100 via wireless links with the base stations 103-106. As illustrated, wireless terminals may include cellular telephones 116 and 118, laptop computers 120 and 122, desktop computers 124 and 126, and data terminals 128 and 130. However, the cellular wireless communication system 100 supports communications with other types of wireless terminals as well. As is generally known, devices such as laptop computers 120 and 122, desktop computers 124 and 126, data terminals 128 and 130, and cellular telephones 116 and 118, are enabled to "surf" the Internet 114, transmit and receive data communications such as email, transmit and receive files, and to perform other data operations. Many of these data operations have significant download data-rate requirements while the upload data-rate requirements are not as severe. Some or all of the wireless terminals 116-130 are therefore enabled to support the EDGE operating standard, the GPRS standard, the UMTS/WCDMA standards, and/or the GSM standards.

Figure 2:
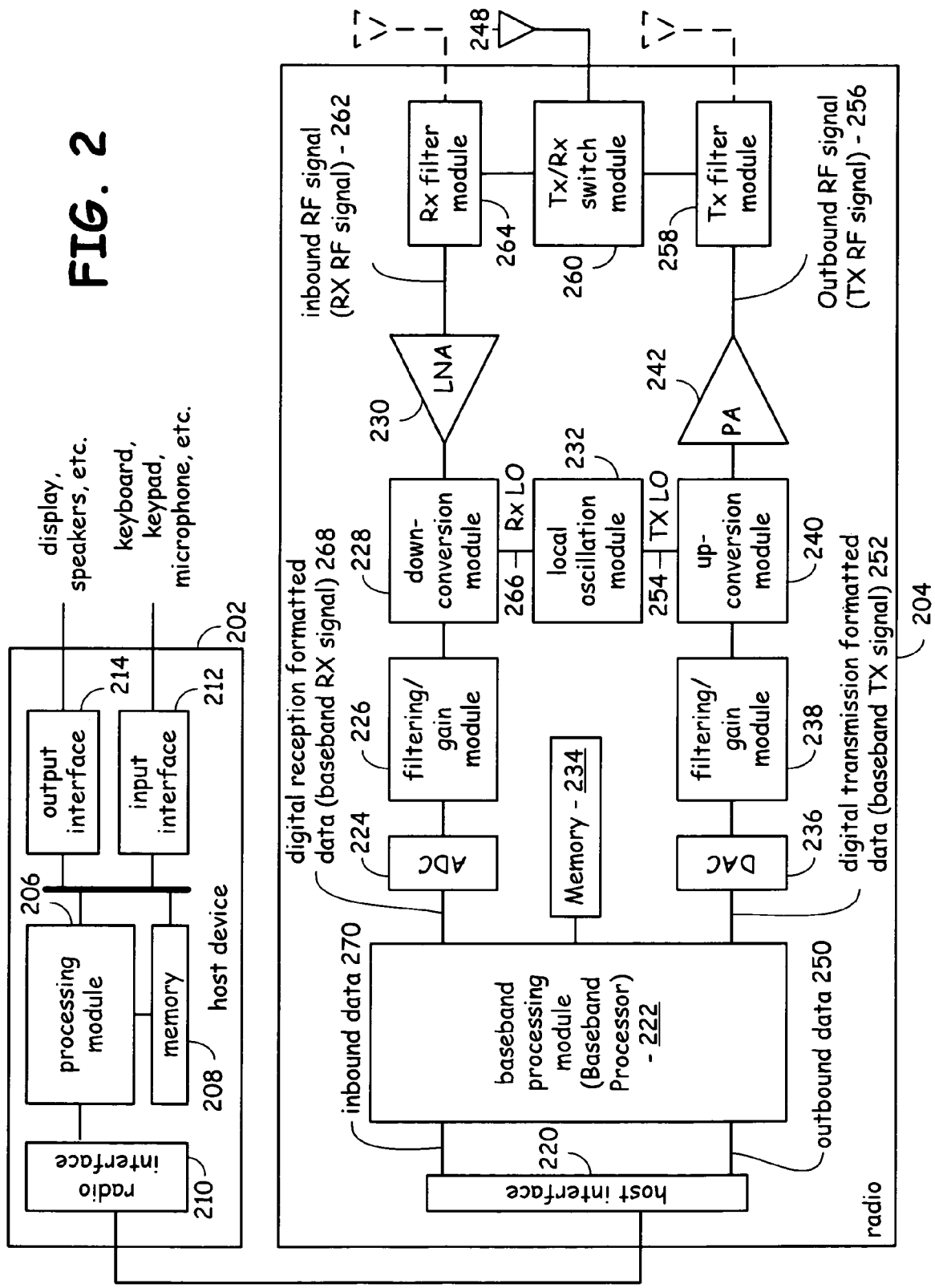
FIG. 2 is a block diagram functionally illustrating a wireless terminal constructed according to the present invention.

FIG. 2 is a schematic block diagram illustrating a wireless terminal that includes host processing components 202 and an associated radio 204. For cellular telephones, the host processing components and the radio 204 are contained within a single housing. In some cellular telephones, the host processing components 202 and some or all of the components of the radio 204 are formed on a single Integrated Circuit (IC). For personal digital assistants hosts, laptop hosts, and/or personal computer hosts, the radio 204 may reside within an expansion card and, therefore, reside be house separately from the host processing components 202. The host processing components 202 include at least a processing module 206, memory 208, radio interface 210, an input interface 212, and an output interface 214. The processing module 206 and memory 208 execute instructions to support host terminal functions. For example, for a cellular telephone host device, the processing module 206 performs user interface operations and executes host software programs among other operations.

The radio interface 210 allows data to be received from and sent to the radio 204. For data received from the radio 204 (e.g., inbound data), the radio interface 210 provides the data to the processing module 206 for further processing and/or routing to the output interface 214. The output interface 214 provides connectivity to an output display device such as a display, monitor, speakers, et cetera such that the received data may be displayed. The radio interface 210 also provides data from the processing module 206 to the radio 204. The processing module 206 may receive the outbound data from an input device such as a keyboard, keypad, microphone, et cetera via the input interface 212 or generate the data itself. For data received via the input interface 212, the processing module 206 may perform a corresponding host function on the data and/or route it to the radio 204 via the radio interface 210.

Radio 204 includes a host interface 220, baseband processing module (baseband processor) 222, analog-to-digital converter 224, filtering/gain module 226, down conversion module 228, low noise amplifier 230, local oscillation module 232, memory 234, digital-to-analog converter 236, filtering/gain module 238, up-conversion module 240, power amplifier 242, RX filter module 264, TX filter module 258, TX/RX switch module 260, and antenna 248. Antenna 248 may be a single antenna that is shared by transmit and receive paths (half-duplex) or may include separate antennas for the transmit path and receive path (full-duplex). The antenna implementation will depend on the particular standard to which the wireless communication device is compliant.

The baseband processing module 222 in combination with operational instructions stored in memory 234, execute digital receiver functions and digital transmitter functions. The digital receiver functions include, but are not limited to, digital intermediate frequency to baseband conversion, demodulation, constellation demapping, descrambling and/or decoding. The digital transmitter functions include, but are not limited to, encoding, scrambling, constellation mapping, modulation, and/or digital baseband to IF conversion. The transmit and receive functions provided by the baseband processing module 222 may be implemented using shared processing devices and/or individual processing devices. Processing devices may include microprocessors, microcontrollers, digital signal processors, microcomputers, central processing units, field programmable gate arrays, programmable logic devices, state machines, logic circuitry, analog circuitry, digital circuitry, and/or any device that manipulates signals (analog and/or digital) based on operational instructions. The memory 234 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 222 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 204 receives outbound data 250 from the host processing components via the host interface 220. The host interface 220 routes the outbound data 250 to the baseband processing module 222, which processes the outbound data 250 in accordance with a particular wireless communication standard (e.g., UMTS/WCDMA, GSM, GPRS, EDGE, et cetera) to produce digital transmission formatted data 252. The digital transmission formatted data 252 is a digital base-band signal or a digital low IF signal, where the low IF will be in the frequency range of zero to a few kilohertz/megahertz.

The digital-to-analog converter 236 converts the digital transmission formatted data 252 from the digital domain to the analog domain. The filtering/gain module 238 filters and/or adjusts the gain of the analog signal prior to providing it to the up-conversion module 240. The up-conversion module 240 directly converts the analog baseband or low IF signal into an RF signal based on a transmitter local oscillation 254 provided by local oscillation module 232. The power amplifier 242 amplifies the RF signal to produce outbound RF signal 256, which is filtered by the TX filter module 258. The TX/RX switch module 260 receives the amplified and filtered RF signal from the TX filter module 258 and provides the output RF signal 256 signal to the antenna 248, which transmits the outbound RF signal 256 to a targeted device such as a base station 103-106.

The radio 204 also receives an inbound RF signal 262, which was transmitted by a base station via the antenna 248, the TX/RX switch module 260, and the RX filter module 264. The low noise amplifier 230 receives inbound RF signal 262 and amplifies the inbound RF signal 262 to produce an amplified inbound RF signal. The low noise amplifier 230 provides the amplified inbound RF signal to the down conversion module 228, which converts the amplified inbound RF signal into an inbound low IF signal or baseband signal based on a receiver local oscillation 266 provided by local oscillation module 232. The down conversion module 228 provides the inbound low IF signal (or baseband signal) to the filtering/gain module 226, which filters and/or adjusts the gain of the signal before providing it to the analog to digital converter 224. The analog-to-digital converter 224 converts the filtered inbound low IF signal (or baseband signal) from the analog domain to the digital domain to produce digital reception formatted data 268. The baseband processing module 222 demodulates, demaps, descrambles, and/or decodes the digital reception formatted data 268 to recapture inbound data 270 in accordance with the particular wireless communication standard being implemented by radio 204. The host interface 220 provides the recaptured inbound data 270 to the host processing components 202 via the radio interface 210.

Figure 3:
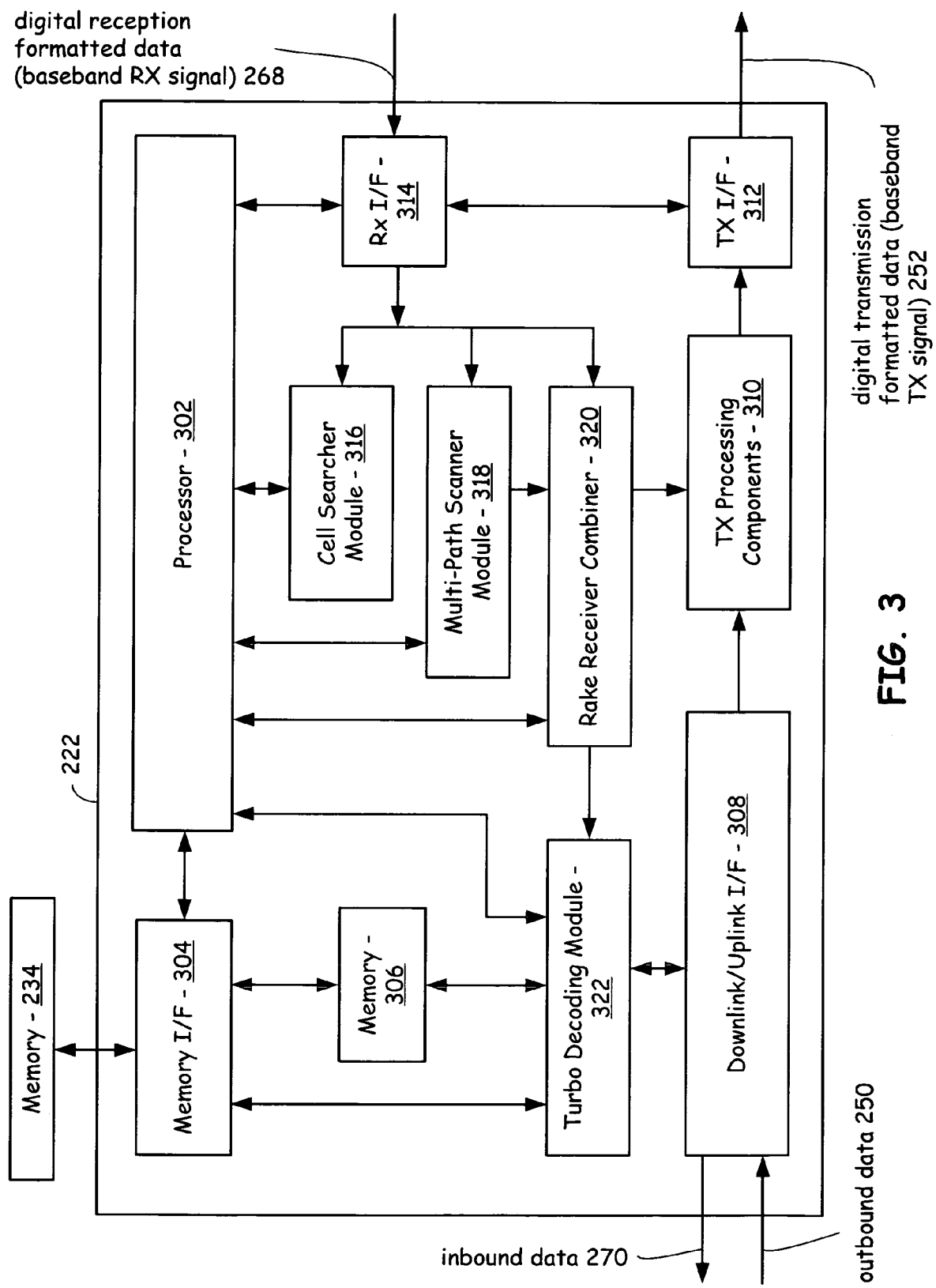
FIG. 3 is a block diagram illustrating components of a baseband processing module according to an embodiment of the present invention.

FIG. 3 is a block diagram illustrating components of a baseband processing module 222 according to an embodiment of the present invention. Components of baseband processing module (baseband processor) 222 include a processor 302, a memory interface 304, onboard memory 306, a downlink/uplink interface 308, TX processing components 310, and a TX interface 312. The baseband processing module 222 further includes an RX interface 314, a cell searcher module 316, a multi-path scanner module 318, a rake receiver combiner 320, and a turbo decoding module 322. The baseband processing module 222 couples in some embodiments to external memory 234. However, in other embodiments, memory 306 fulfills the memory requirements if the baseband processing module 302.

As was previously described with reference to FIG. 2, the baseband processing module receives outbound data 250 from coupled host processing components 202 and provides inbound data 270 to the coupled host processing components 202. Further, the baseband processing module 222 provides digital formatted transmission data (baseband TX signal) 252 to a coupled RF front end. Further, the baseband processing module 222 receives digital reception formatted data (baseband RX signal) 268 from the coupled RF front end. As was previously described with reference to FIG. 2, an ADC 222 produces the digital reception formatted data (baseband RX data) 268 while the DAC 236 of the RF front end receives the digital transmission formatted data (baseband TX signal) 252 from the baseband processing module 222.

According to the particular illustrated embodiment of the present invention, the downlink/uplink interface 308 is operable to receive the outbound data 250 from coupled host processing components, e.g., the host processing component 202 via host interface 220. Further, the downlink/uplink interface 308 is operable to provide inbound data 270 to the coupled host processing components 202 via the host interface 220. As the reader will appreciate, the baseband processing module 222 may be formed on a single integrated circuit with the other components of radio 204. Further, the radio 204 may be formed in a single integrated circuit along with the host processing components 202. Thus, in such case, all components of FIG. 2 excluding the antenna, display, speakers, et cetera and keyboard, keypad, microphone, et cetera may be formed on a single integrated circuit. However, in still other embodiments, the baseband processing module 222 and the host processing components 202 may be formed on a separate integrated circuit. Many differing constructs integrated circuit constructs are possible without departing from the teachings of the present invention.

TX processing component 310 and TX interface 312 communicatively couple to the RF front end as illustrated in FIG. 2 and to the downlink/uplink interface 308. The TX processing components 310 and TX interface 312 are operable to receive the outbound data from the downlink/uplink interface 304, to process the outbound data to produce the baseband TX signal 252 and to output the baseband TX signal 252 to the RF front end as was described with reference to FIG. 2.

RX processing components including the RX interface 314, rake receiver combiner 320 and in some cases the processor 302 are operable to receive the RX baseband signal 268 from the RF front end. These components are also operable to produce a set of IR samples from the RX baseband signal 268 and to transfer the sets of IR samples to the memory 234 and/or 306. According to the present invention, the IR samples may form all or part of a received turbo code word. As is generally, channel coding is used in an attempt to overcome less than perfect channel conditions. Coding operations include encoding information on the transmit side of a wireless link to produce a code word, e.g., a turbo code word. This turbo code word is generally punctured and the punctured turbo code word is then transmitted to the receiver. The receiver receives a version of the transmitted punctured turbo code word that has been operated upon by a channel between the wireless transmitter and the wireless receiver. Upon receipt, this received turbo code word is depunctured and then decoded. A successful decode of the turbo code word yields the transmitted data.

With IR operations, a portion of a turbo code word is transmitted from the transmitter to the receiver. If the receiver fails to successfully decode the turbo code word, e.g., cyclical redundancy check (CRC) indicates no errors, based upon the contents of received data, the transmitter will send another portion of the turbo code word. The additional portion(s) of the turbo code word transmitted may differ from the previous portion(s) of the turbo code transmitted due to a different puncturing pattern, different coding rate, different data transmission rate, etc. In IR operations, a subsequent transmitted turbo code transmitted may be the same as a previously transmitted turbo code. In any case, according to the present invention, each of the initial and subsequent code words or turbo code words are received, combined, and turbo decoded. In many operations, a successful decoding of the turbo code word results after combining and decoding multiple received portions transmissions carrying all or a portion of the turbo code word.

According to the present invention, the turbo decoding module 322 is operable to receive sets of IR samples from the memory 234 and/or 306, to combine the sets of IR samples representing all/portions to produce a turbo code word, to decode the turbo code word that it creates, and to determine whether the turbo decoding operation was successful in error detection operations. When the turbo decoding operations are successful, the turbo decoding module 322 produces the inbound data 270 to the downlink/uplink interface 308. Operations and structure of the turbo decoding module 322 will be described further with reference to FIGS. 4-13. As contrasted to prior decoding operations within radio frequency transceivers, the turbo decoding module 322 of the present invention offloads the processor 302 from its supported operations. While the decoding operations described particularly herein relate to turbo decoding, the principles of the present invention apply equally to other types of decoding operations as well, such as convolutional coding, Low Density Parity Check (LDPC) coding, and other types of channel coding.

Figure 4:
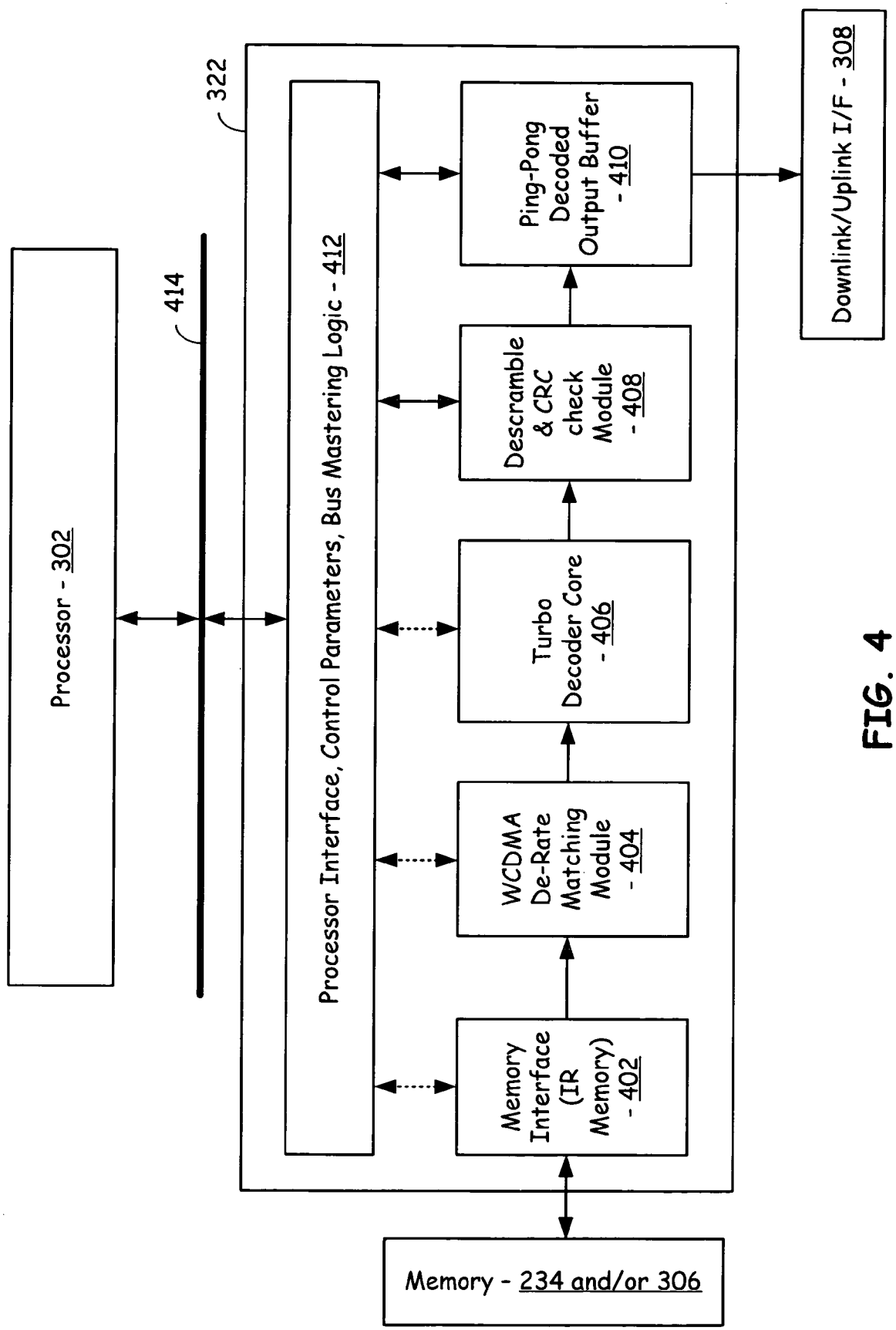
FIG. 4 is a block diagram illustrating components of a turbo decoding module according to an embodiment of the present invention.

FIG. 4 is a block diagram illustrating components of a turbo decoding module 322 according to an embodiment of the present invention. As is shown, the turbo decoding module 322 includes a memory interface 402 that is communicatively coupled to the memory 234 and/or 306. The turbo decoding module 322 further includes a WCDMA de-rate matching module 404, a turbo decoder core 406, the structure of which will be described further with reference to FIGS. 5 and 6 and the operations of which will be described further with reference to FIGS. 8-10. The turbo decoding module 322 further includes a descrambling and cyclical redundancy check (CRC) module 408, the operations of which will be described further with reference to FIGS. 11-13. Finally, the turbo decoding module 322 further includes an output buffer 410 which may be a ping-pong decoded output buffer. The output buffer 410 couples to downlink/uplink interface 308. The turbo decoding module 322 further includes a processor interface, control parameters, and bus mastering logic 412 that couples to processor 302 via a processor bus 414.

Figure 5:
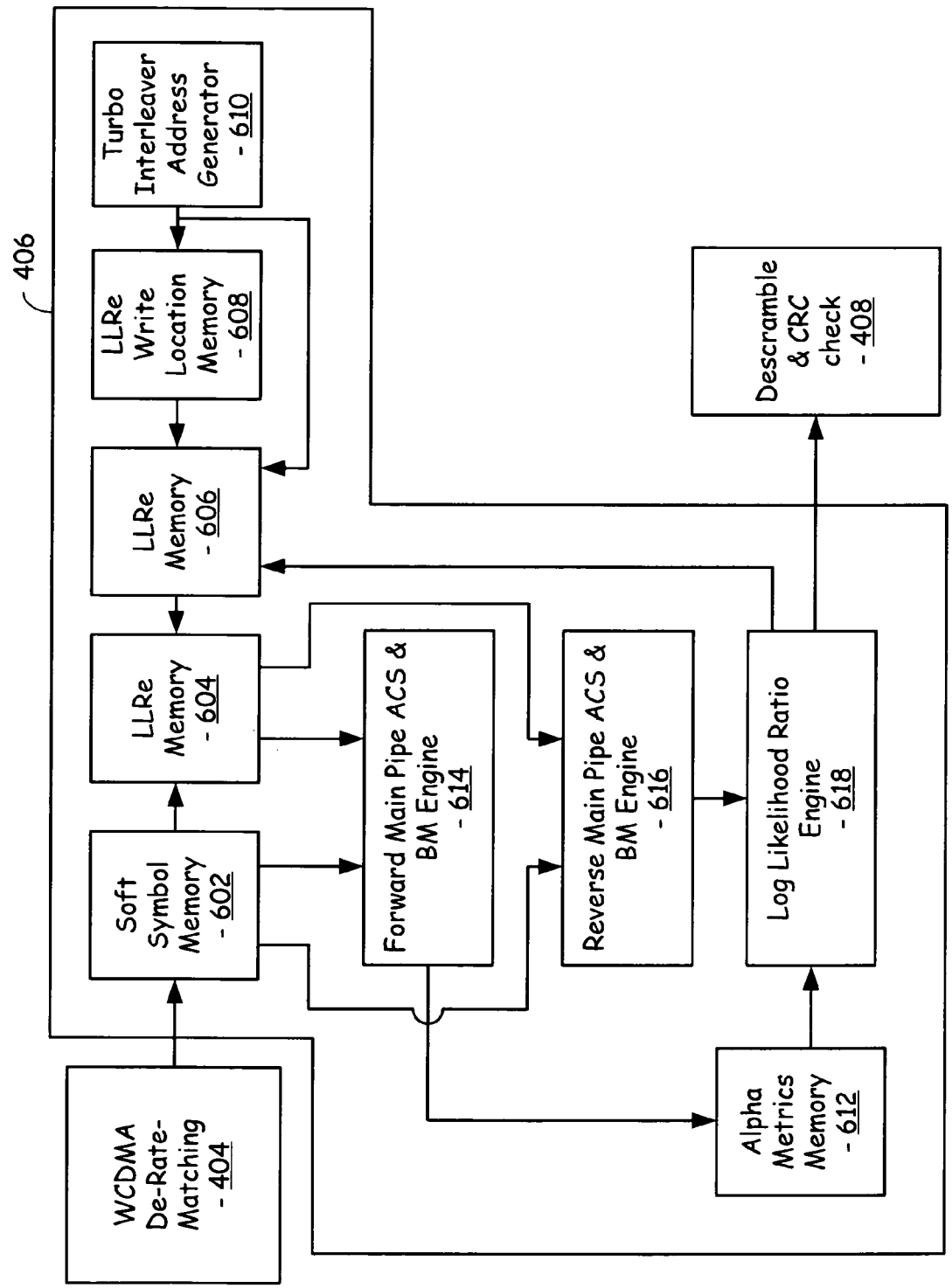
FIG. 5 is a block diagram illustrating components of a turbo decoding core of the turbo decoding module according to an embodiment of the present invention.

FIG. 5 is a block diagram illustrating components of a turbo decoding core 406 of the turbo decoding module 322 according to an embodiment of the present invention. The turbo decoder core 406 includes a soft symbol memory 602 that stores soft symbols of the turbo code word, Alpha Metrics Memory 612 that stores intermediate results, and LLRe memory 606 and 608 that store information employed in the turbo decoding process. Turbo Interleaver Address Generator 610 generates addresses for memory access that are employed to access LLRe memory 608 and 606 for use in the turbo decoding process. Data required by the turbo decoding process is dependent upon the particular turbo codes that are used. For example, the wideband CDMA/UMTS standard calls for a particular type of turbo code word(s) to be used. Thus, turbo decoder core 406 operates is dependent upon the turbo codes that are implemented.

The turbo decoder core 406 includes a forward main pipe add compare select engine 614 that communicatively couples to at least one of the plurality of registers 602-608. The forward main pipe add compare select engine 614 is operable to perform forward add, compare, and select operations on a turbo code word during a forward turbo decoding operation code process using parameters retrieved from memory 604 and memory 602. As is generally known during a turbo decoding operation, a turbo code trellis and corresponding parameters thereof is employed to generate/update metrics based upon the soft symbol values of the turbo code. The forward main pipe add compare select engine 614 performs a forward pass through the trellis to produce/update the metrics, the trellis operations corresponding to the turbo code employed. A Viterbi decoder is be employed by the turbo decoder core 406 in traversing the trellis according to one embodiment.

The turbo decoder core 406 further includes a reverse main pipe add compare select engine 616 that couples to at least one of the plurality of registers 602-606. The reverse main pipe add compare select engine 614 is operable to perform add, compare, and select operations on the turbo code word as turbo decoding core 406 makes a reverse pass through the corresponding trellis. The turbo decoder core 406 further includes a metrics memory 612 that communicatively couples to the forward main pipe add compare select engine 614 and to the log likelihood ratio engine 618. The metrics memory 612 is operable to store a set of metrics corresponding to the turbo decoding operations of the turbo code.

Finally, the turbo decoder core 406 includes a log likelihood ratio engine 618 that communicatively couples to the reverse main pipe add compare select engine 616 to the metric memory 612 and to the descrambling CRC module 408. The log likelihood ratio engine 618 is operable to process results produced by the forward main pipe add compare select engine 614 and the reverse main pipe add compare select engine 616 to produce a turbo decoded result. With some embodiments of the turbo decoding module 322 of the present invention, the decoding produces a Media Access Control (MAC) packet or a portion thereof that is further operated upon by the turbo decoding module 322.

Figure 6:
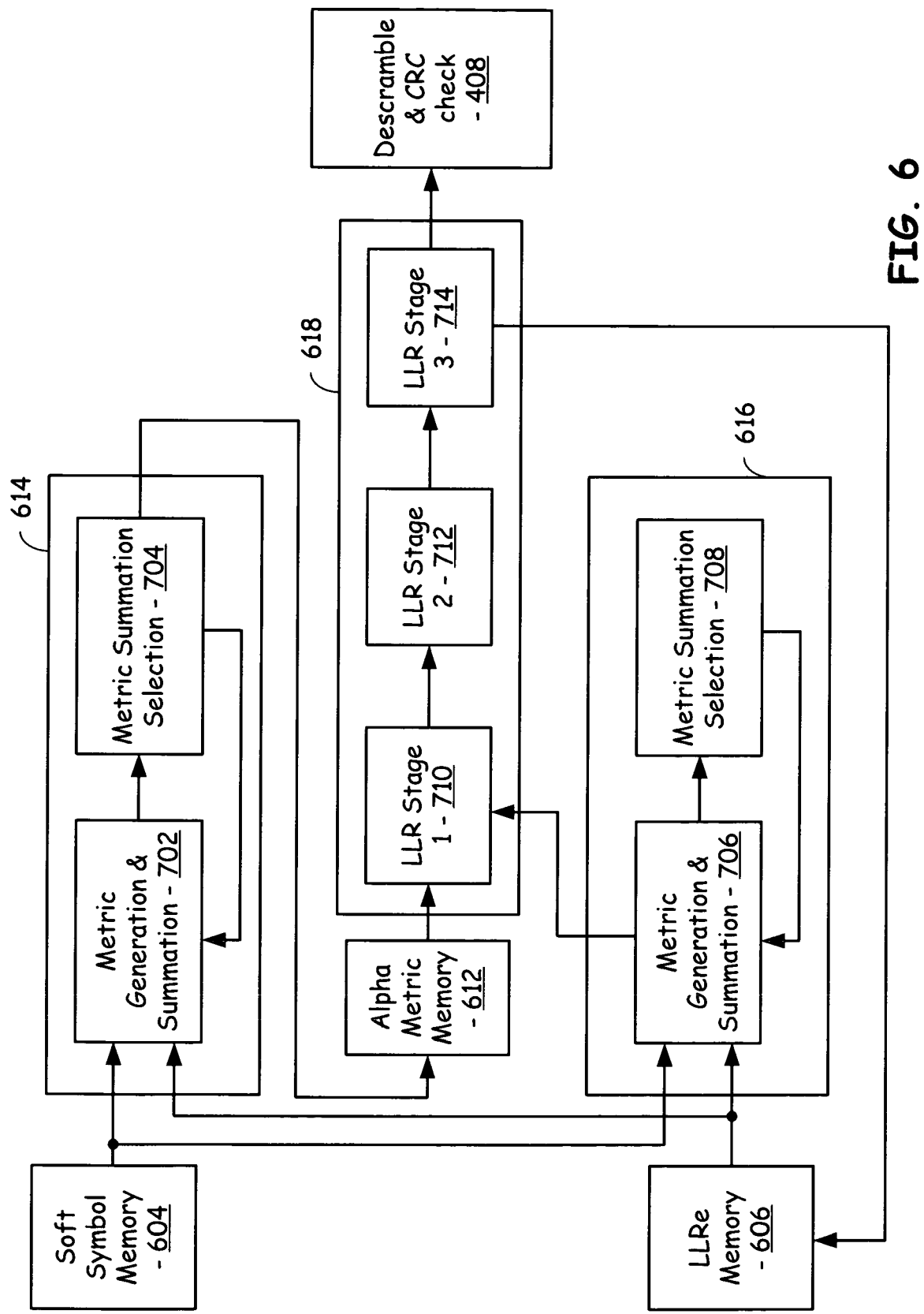
FIG. 6 is a block diagram illustrating components of the turbo decoding core of the turbo decoding module according to an embodiment of the present invention as they relate to data flow during turbo decoding operations.

FIG. 6 is a block diagram illustrating components of the turbo decoding core of the turbo decoding module according to an embodiment of the present invention as they relate to data flow during turbo decoding operations. The components of the forward main pipe add compare select engine 614 and the reverse main pipe add compare select engine 616 as well as components of the log likelihood ratio engine 618 are further illustrated in the manner in which they couple to memory 604 and 606 are illustrated in more detail in FIG. 6.

The forward main pipe add compare select engine 614 receives soft symbols from soft symbol memory 604 and parameters to employ in the add compare select process from LLRe memory 606. The forward main pipe add compare select engine 614 includes a metric generation and summation block 702 and a metric summation selection block 704. The metric generation and summation block 702 produces a maximum number of metric check sums for the turbo code word for each trellis step. The metric summation selection block 704 is operable to perform a plurality of comparisons on the maximum number of metric check sums produced by the metric generation and summation block 702. Further, the metric summation selection block 704 is operable to select a group of metric check sums from the maximum number of check sums and to output a selected group of metric check sums. With the metric generation and summation block 702 producing the maximum number of metric check sums for each decoding operation, e.g., each step in the trellis of the corresponding turbo code, a single clock cycle will yield a particular result for the particular trellis step.

The reverse main pipe add compare select engine 616 includes a metric generation and summation block 706 and a metric summation selection block 708. The reverse main pipe add compare select engine 616 communicatively couples to soft symbol memory 604 into LLRe memory 606. The metric generation and summation block 706 is operable to produce a maximum number of metric check sums for the turbo code word for each decoding operation. Further, the metric summation selection block is operable to perform a plurality of comparisons on the maximum number of metric check sums produced by the metric generation and summation block 706. Further, the metric summation selection block 708 is operable to select a group of metric check sums from the maximum number of metric check sums then to output a selected group of the metric check sums.

The log likelihood ratio engine 618 includes three stages, LLR stage 1-710, LLR stage 2-712, and LLR stage 3-714. The log likelihood ratio engine 618 is operable to receive input from the alpha metric memory 612 and the reverse main pipe metric generation and summation block 706. The output of the log likelihood ratio engine 618 contains the decoded turbo code word and the LLRe information that may be recirculated to the turbo decoder core for subsequent decode iterations.

Figure 7:
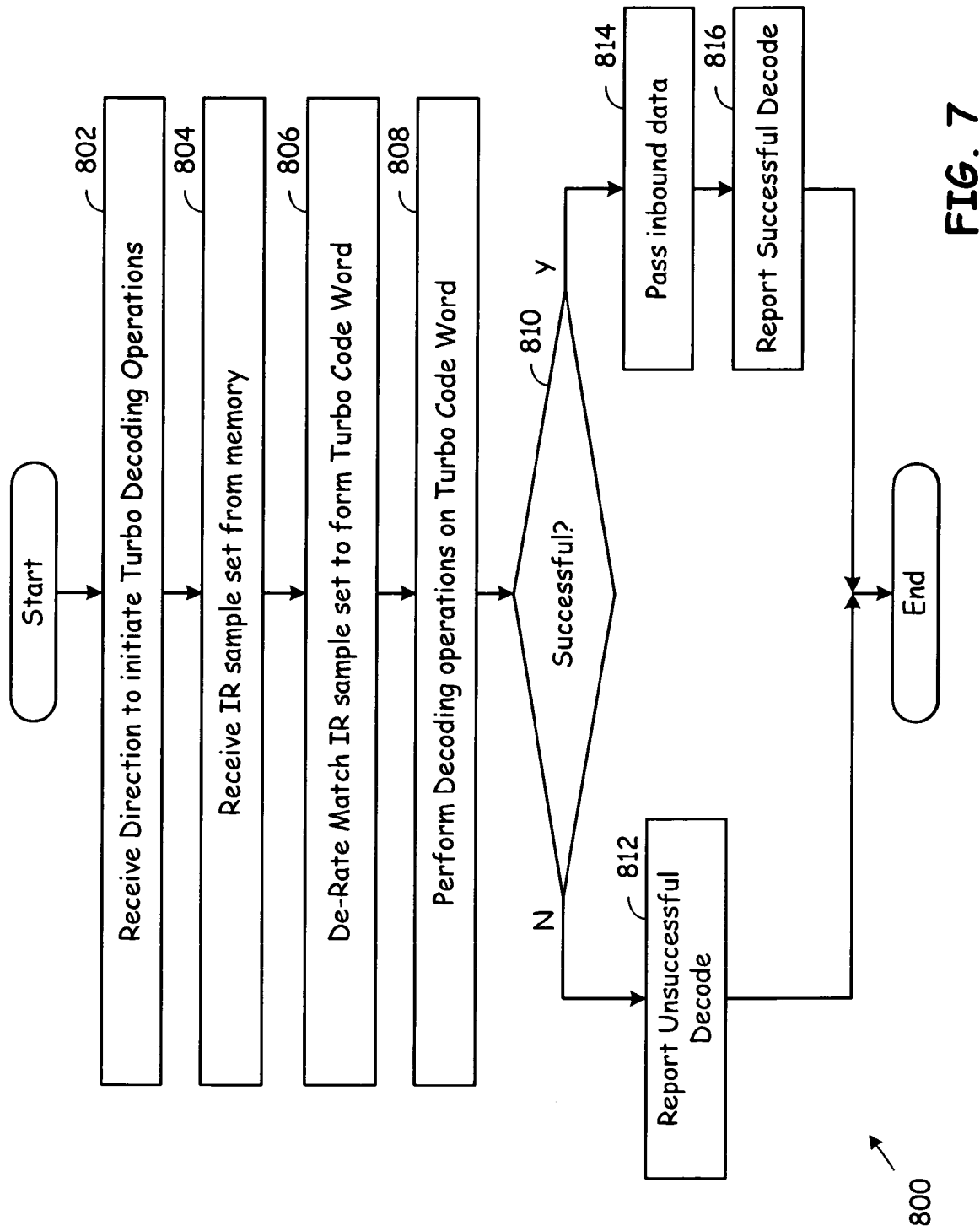
FIG. 7 is a flow chart illustrating IR sample/Turbo Decoding operations according to an embodiment of the present invention.

FIG. 7 is a flow chart illustrating IR sample/Turbo Decoding operations according to an embodiment of the present invention. These operations 800 include first receiving a direction to initiate turbo decoding operations (Step 802). This direction may be received from the coupled processor 302, from the rake receiver combiner 320 or from another source. After receiving the direction to initiate the turbo decoding operations, the turbo decoding module receives a set of IR samples from memory corresponding to the turbo code word (Step 804). The IR sample set is then rate de-matched to form the turbo code word (step 806).

Figure 9:
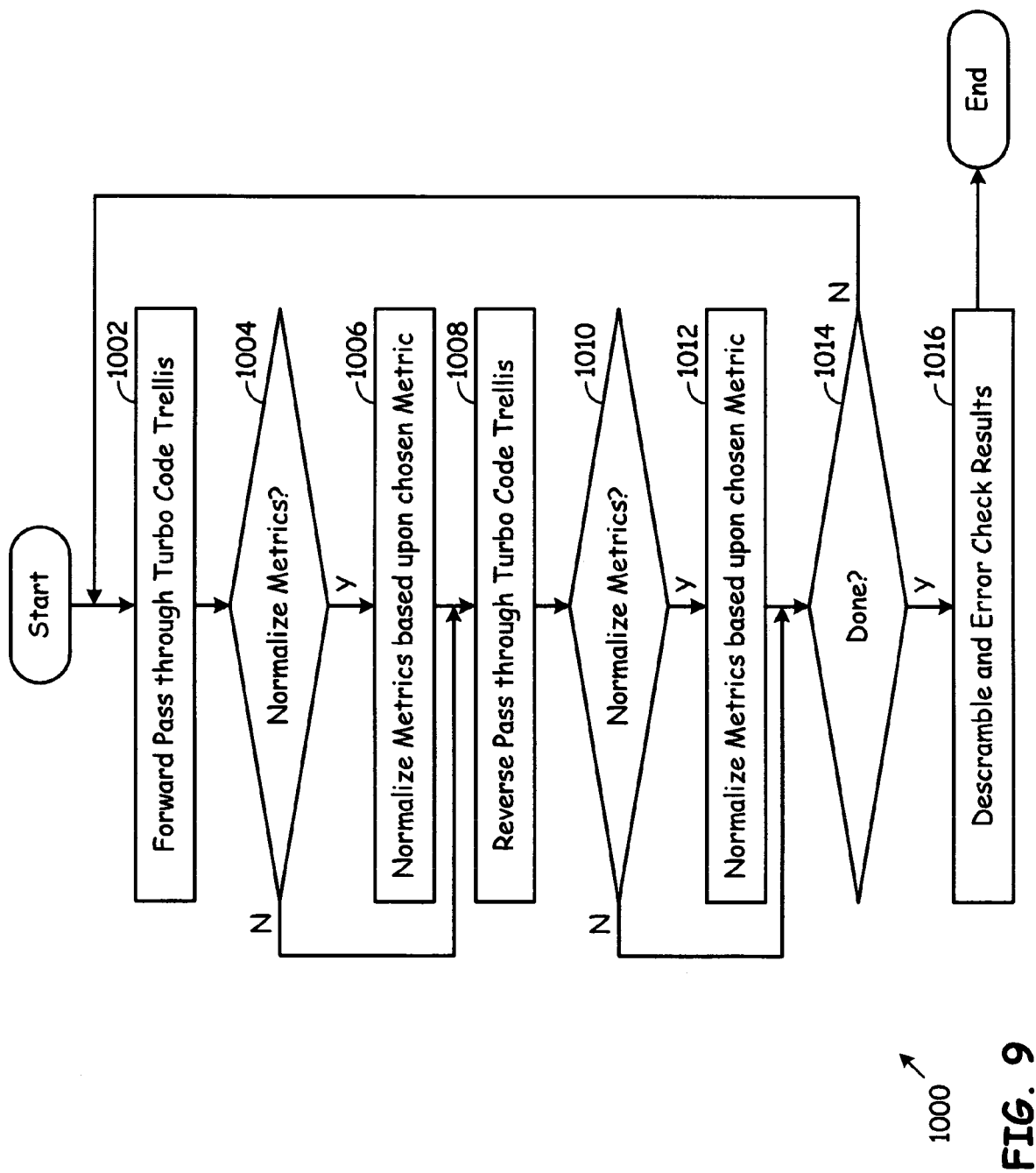
FIG. 9 is a flow chart illustrating aspects of metric normalization according to various embodiments of the present invention.

With the turbo code word formed, the turbo decoding module performs decoding operations on the turbo code word (Step 808). One particular example of these operations is illustrated in FIG. 9. After the turbo code word has been turbo decoded, the descrambling and CRC check module 408 descrambles the decoded turbo code word to produce all or a portion of a corresponding MAC packet. The descrambling and CRC check module 408 is then operable to determine whether the turbo decoding operations were successful. One particular technique for determining whether the operations were successful is done via a CRC block contained in a MAC packet that is produced from the turbo decoding operations. If the turbo decoding operations were not successful, as determined at Step 810, the unsuccessful turbo decoding operations are reported by the turbo decoding module. Such reporting may simply include writing the status of the decoding operations to memory 234 or 306. Alternatively, reporting the unsuccessful turbo decoding operations may include sending notification to processor 302. The processor 302 may then initiate Automatic Retransmission reQuest (ARQ) operations so that the transmitter will send other portions or redundant portions of the turbo code word in subsequent transmissions.

If the turbo decoding operations are successful as determined at Step 810, the turbo decoding module passes the inbound data via the output buffer 410 to the downlink/uplink interface 308 (Step 814). The turbo decoding module then may report the successful decoding operations (Step 816). As was the case at Step 812, reporting a successful turbo decoding operation may include sending a message to processor 302 or writing a particular location in memory 234 or 306. When the turbo decoding operations are successful, the sets of IR samples corresponding to the turbo code word may be cleared from the memory 234 and/or 306 to accommodate for the next set of new data. From both Step 812 and Step 816, operation ends.

Figure 8:
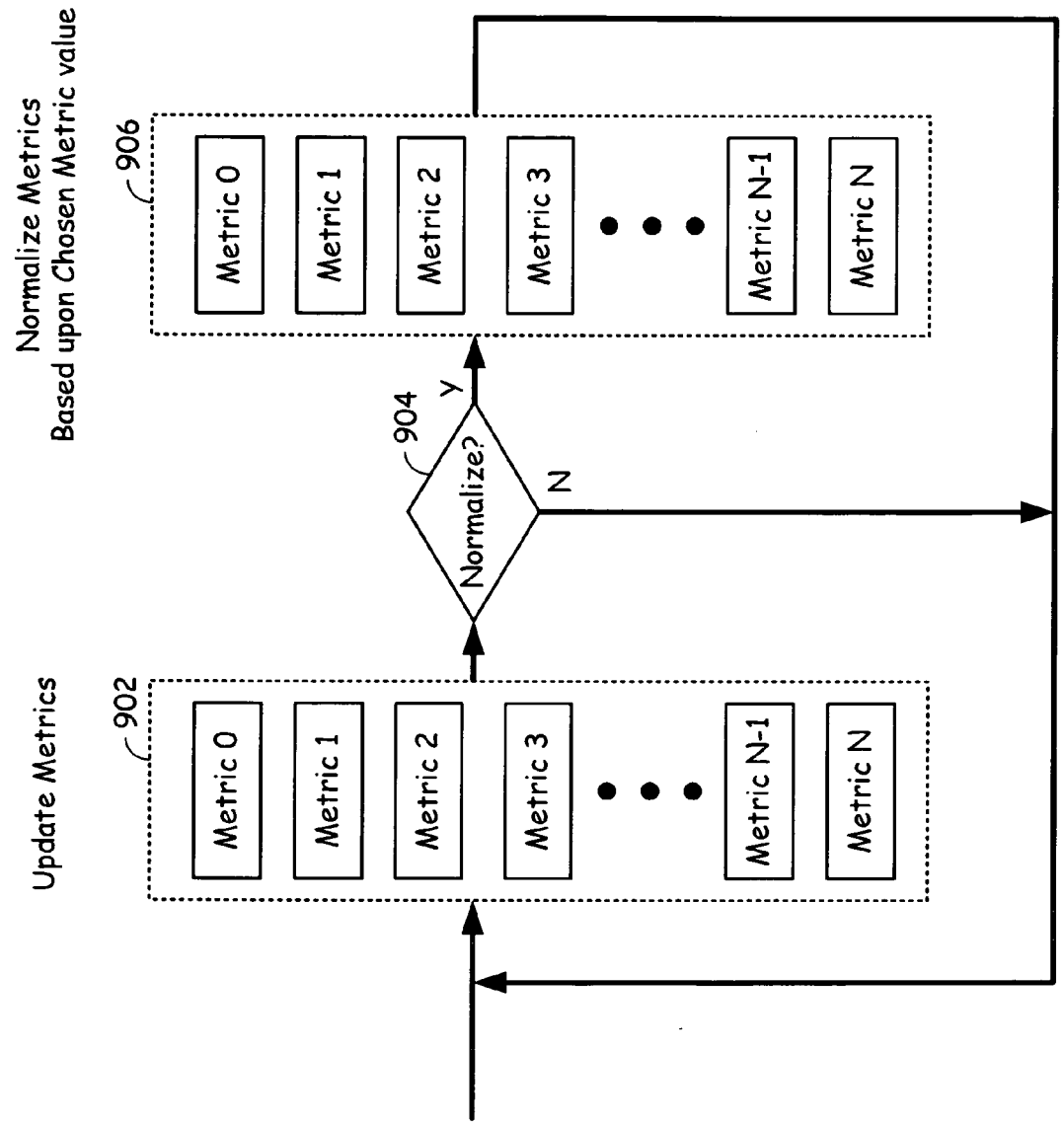
FIG. 8 is a chart illustrating metric normalization according to an embodiment of the present invention.

FIG. 8 is a chart illustrating metric normalization according to an embodiment of the present invention. As is generally known, in turbo decoding operations in which a trellis is employed, e.g., with Viterbi decoding operations, a plurality of metrics are stored that represent particular paths taken through the turbo code trellis. According to the present invention, the decoding process may include multiple forward passes and multiple reverse passes through the corresponding turbo code trellis. At each step through the trellis or decision point, metrics corresponding to particular paths of the trellis are updated. Because multiple paths both in the forward direction and reverse direction through the trellis are made, the metrics, which increase in value at each trellis step, may grow to be unduly large. Thus, according to one aspect of the present invention, each metric of a set of metrics maintained by the turbo decoding module is represented by not only a magnitude but by a sign, e.g., plus or minus, as well.

FIG. 8 illustrates diagrammatically a plurality of metrics, metric 0 through metric N maintained by the turbo decoding module 322 of the present invention for the decoding operations of a particular turbo code word. According to an aspect of the present invention, the turbo decoding module 322 identifies a chosen metric of these set of metrics 902 or 906. Then, periodically, the turbo decoding module normalizes each other metric of the set of metrics based upon the chosen metric.

At each trellis step during the turbo decoding operation, the Turbo Decoder Core 406 updates the metrics, as shown at operation 902, and as previously described with reference to FIGS. 5 and 6. At certain operational intervals, a decision is made as to whether to normalize the metrics (Step 904). If the metrics are to be normalized, as determined at Step 904, the metrics are normalized based upon the chosen metric value, as represented at operation 906. If the metrics are not to be normalized, as determined at Step 904, no normalization is performed and the metrics are again updated in a subsequent operation of the turbo decoding module.

The metrics may be normalized as part of each metric updating operation, i.e., each trellis step. Alternately, the metrics may be normalized after each forward pass through the trellis, after each reverse pass through the trellis, after a number of forward or reverse passes through the trellis, when one or more metric values exceeds a threshold, or according to another operation. Of course, the normalization operations may be performed according to more than one of these techniques, e.g., after each forward trellis pass or if any metric value exceeds a threshold.

In one particular aspect of these normalization operations, the identity of the chosen metrics is fixed during all turbo decoding operations of the turbo code word. For example, referring to FIG. 8, it may be determined that metric 0 is the chosen metric. Thus, at each normalization operation represented at operation 906, metrics 1 through N will be normalized based upon the value of metric 0. In another operation, the turbo decoding module itself is operable to select the identity of the chosen metric. In such case, the turbo decoding module selects the identity of the chosen metric. The metric may be chosen at the beginning of a turbo decoding operation or at any point in time during the turbo decoding operation.

FIG. 9 is a flow chart illustrating aspects of metric normalization according to various embodiments of the present invention. Operation 1000 commences with a forward turbo decoding path through a corresponding turbo code trellis (Step 1002). After completion of the forward decoding path through the turbo code trellis, a decision is made whether to normalize the metrics (Step 1004). If it is determined that normalization of the metrics is required, the metrics are normalized based upon the chosen metric (Step 1006). However, if it is determined that normalization of the metrics is not required, operation from Step 1004 proceeds to Step 1008 where a reverse path through the turbo trellis is performed (Step 1008). Alternatively, a plurality of forward passes may be made through the turbo code trellis consecutively.

After the reverse path through the corresponding turbo code trellis is completed at Step 1008, a decision is made as to whether to normalize the metrics (Step 1010). If a decision is made to normalize the metrics after the reverse pass through the turbo code trellis the metrics are normalized based upon the chosen metric (Step 1012). Then, a decision is made as to whether the turbo decoding operations have been completed (Step 1014). If the turbo decoder operations are not completed as determined at Step 1014, operation returns to Step 1002. Further, if normalization was not required as determined at Step 1010, operation also proceeds to Step 1014. As was the case with the forward pass through the corresponding turbo code trellis, multiple consecutive reverse passes through the turbo code trellis may be performed as well. In such case, operation from Step 1012 would return to operation 1018 until the maximum number of reverse passes through the corresponding turbo code trellis have been completed. When turbo decoding operations have been completed as determined at Step 1014, results are passed to the descrambling and CRC check module 408 for descrambling and error checking operations.

While the operations 1000 of FIG. 9 illustrate a number of decision points, e.g., Steps 1004 and 1010, these decision points may be fixed in any given configuration. Thus, for example, with one configuration, the metrics are normalized only after a forward pass through the turbo code trellis while in another configuration, the metrics are normalized only after a reverse pass through the turbo code trellis. Further, in still another configuration, the metrics may be normalized both after a forward pass and after a reverse pass through the turbo code trellis. Moreover, these decision points may actually be evaluated by the turbo decoder core and normalization may only be performed when one or more of the metrics exceeds a threshold. As was described with reference to FIG. 8, metrics may also be normalized at each trellis metric update.

Figure 10:
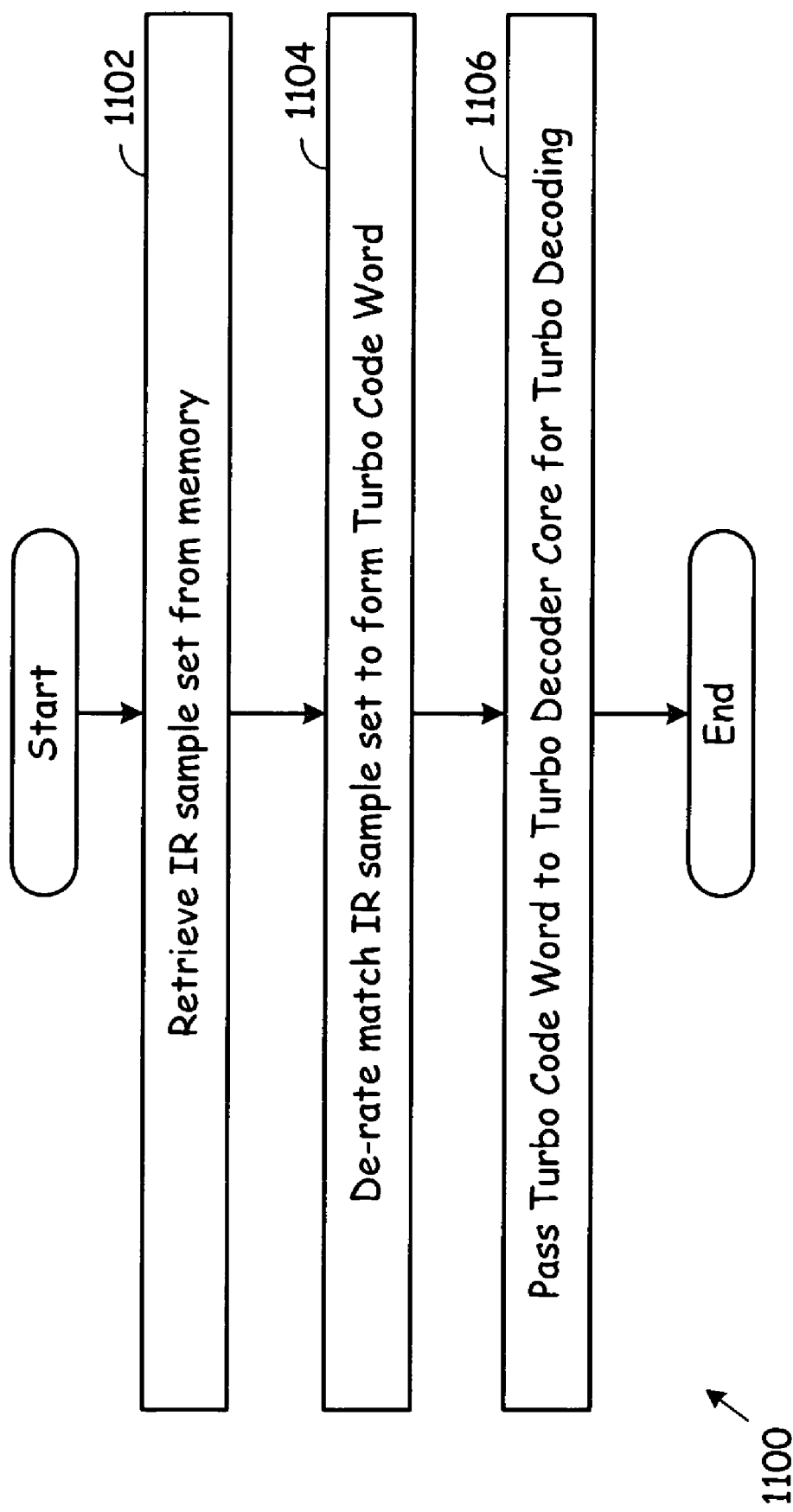
FIG. 10 is a flow chart illustrating the manner in which set(s) of IR sample(s) are operated upon by the Turbo Decoding module of the present invention to produce a turbo code word.

FIG. 10 is a flow chart illustrating the manner in which a set of IR sample(s) is operated upon by the Turbo Decoding module of the present invention to produce a turbo code word. These operations 1100 are performed by the turbo decoding module 322 and particularly by the WCDMA de-rate matching module 404 of the turbo decoding module 322. Operation commences with the turbo decoding module receiving one set of IR samples from memory (Step 1102) The WCDMA de-rate matching module 404 de-rate matches the IR sample set to form a turbo code word (Step 1104) and then passes the turbo code word to the turbo decoder core 406 for turbo decoding (Step 1106).

Figure 11A:
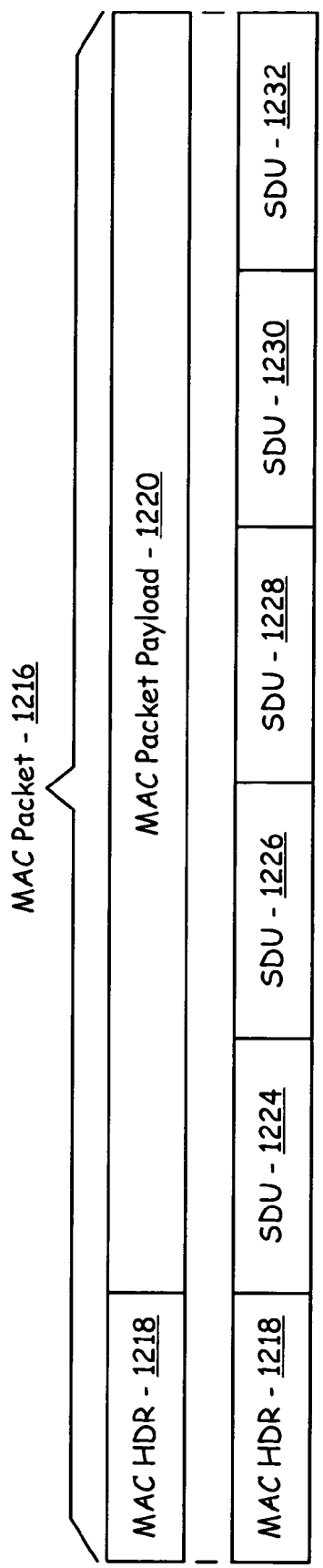
FIGS. 11A, 11B, 11C, and 11D are block diagrams illustrating the manner in which turbo code word(s) are decoded to produce a Media Access Control (MAC) packet and the manner in which the MAC packet is processed by a turbo decoding module according to embodiments of the present invention.

FIGS. 11A, 11B, 11C, and 11D are block diagrams illustrating the manner in which turbo code word(s) are decoded to produce a Media Access Control (MAC) packet and the manner in which the MAC packet is processed by a turbo decoding module 322 according to embodiments of the present invention. Referring particularly to FIG. 11A, a MAC packet 1216 includes a MAC header 1218 and a MAC packet payload 1220. The MAC packet payload 1220 includes a plurality of Service Data Units (SDUs) 1224-1232. It is desired that the MAC packet 1216 be successfully transmitted from the transmitter, e.g., base station, to the receiver, e.g., wireless terminal.

Figure 11B:
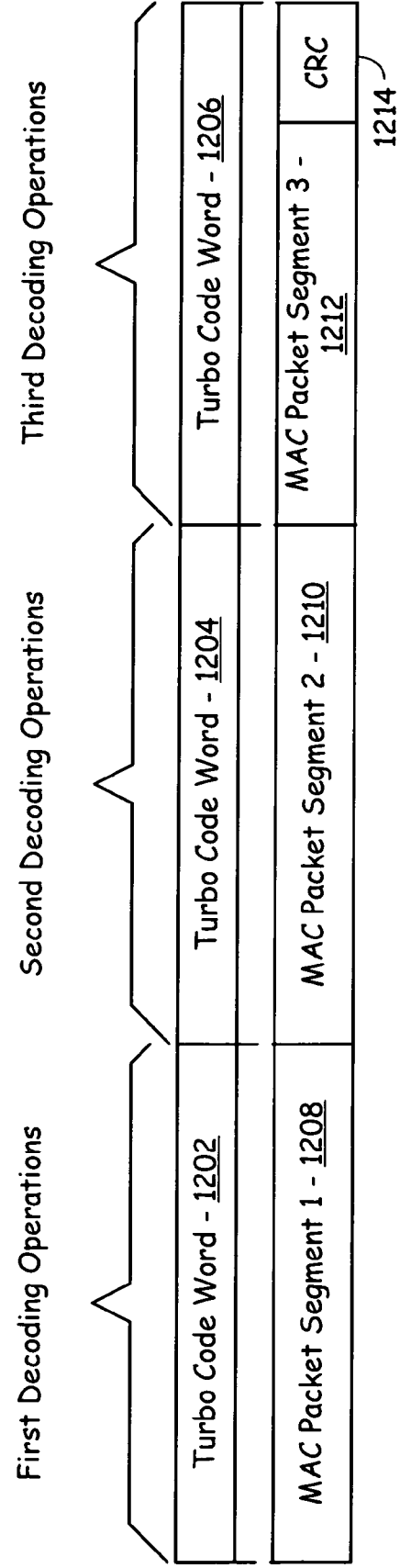

Referring particularly to FIG. 11B, on the transmit side, the MAC packet 1216 may be segmented into a plurality of, e.g., three, MAC packet segments 1208, 1210, and 1212. Appended to the MAC packet segments 1208, 1210, and 1212, is a cyclical redundancy check 1214. The transmitter forms turbo code words 1202, 1204, and 1206 to carry the MAC packet segments 1208, 1210, and 1212 and the CRC 1214. For example, turbo code word 1202 carries MAC packet segment 1-1208, turbo code word 1204 carries MAC packet segment 2-1210 and turbo code word 1206 carries MAC packet segment 3-1212 with CRC 1214. The turbo code words 1202-1206 are concatenated and transmitted from the transmitter and received by the receiver. The turbo decoding module of the present invention receives and operates upon the turbo code words 1202-1206. After turbo decoding operations are completed on the turbo code words 1202-1206, the turbo decoding module performs error checking operations on the received MAC packet 1216 using the CRC 1214. A successful error checking operation yields the MAC packet 1216 at the receiver. An unsuccessful error checking operation results in additional ARQ operations for the turbo code words 1202-1206.

Figure 11C:
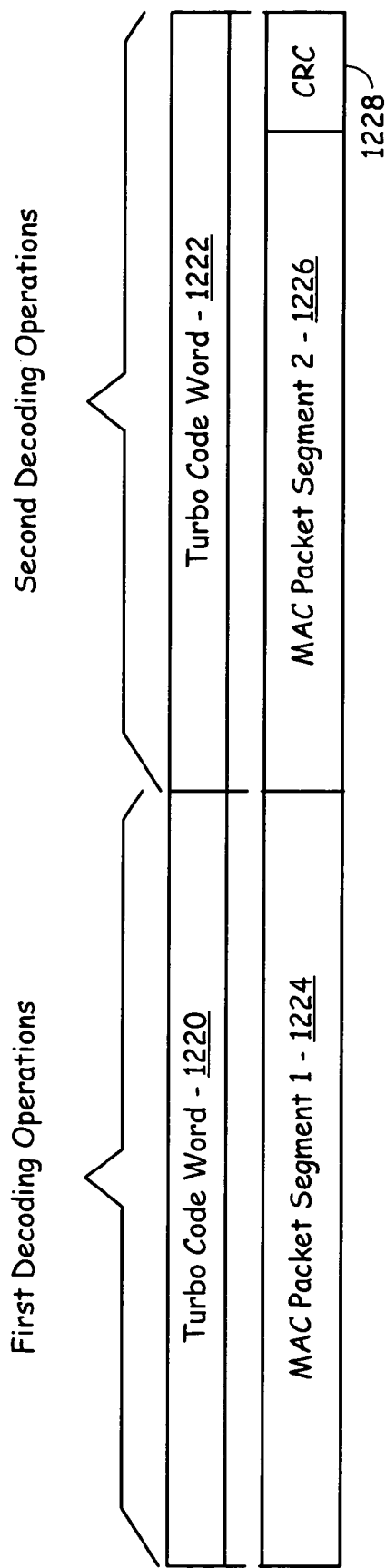

Referring particularly to FIG. 11C, on the transmit side, the MAC packet 1216 may also be segmented into two MAC packet segments 1224 and 1226. Appended to the MAC packet segments 1224 and 1226 is a cyclical redundancy check 1228. The transmitter forms turbo code words 1220 and 1222 to carry the MAC packet segments 1224 and 1226 and the CRC 1228. The turbo code words 1220 and 1222 are concatenated and transmitted from the transmitter and received by the receiver. The turbo decoding module of the present invention receives and operates upon each of the turbo code words 1220 and 1222 separately. After turbo decoding operations are completed on the turbo code words 1220 and 1222, the turbo decoding module performs error checking operations on the received MAC packet 1216 using the CRC 1228. A successful error checking operation yields the MAC packet 1216 at the receiver. An unsuccessful error checking operation results in additional ARQ operations for the turbo code words 1220 and 1222.

Figure 11D:
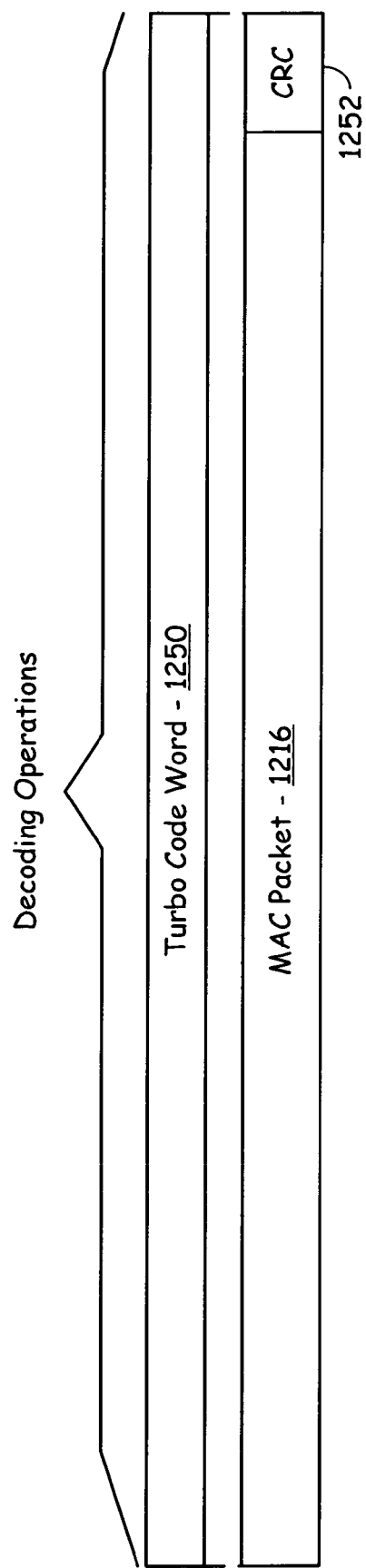

Now, referring particularly to FIG. 11D, on the transmit side, the MAC packet 1216 may have appended thereto a cyclical redundancy check 1252 and be carried by a single turbo code word 1250. The turbo code word 1250 is transmitted from the transmitter and received by the receiver. The turbo decoding module of the present invention receives and operates upon the turbo code word 1250. After turbo decoding operations are completed on the turbo code word 1250, the turbo decoding module performs error checking operations on the received MAC packet 1216 using the CRC 1252. A successful error checking operation yields the MAC packet 1216 at the receiver. An unsuccessful error checking operation results in additional ARQ operations for the turbo code word 1250.

Referring to FIGS. 11A-11D, according to an aspect to the present invention, the turbo decoding module 322 not only is operable to decode turbo code words 1202-1206 but is also operable to examine the MAC header 1218 of the MAC packet 1216. Further, the turbo decoding module is operable to determine the boundaries of service data units (SDUs) 1224, 1226, 1228, 1230, and 1232 carried by the MAC packet 1220. Finally, the turbo decoding module is operable to output the MAC packet 1216 along with the boundaries of the SDUs 1224-1232 to the downlink/uplink interface 308 as the inbound data 270. Thus, as compared to prior systems in which the processor 302 was required to perform error checking operations upon the MAC packet 1216 and segregate the MAC packet 1216 into the SDUs 1224-1232, the turbo decoding module 322 of the present invention performs such error checking and/or MAC packet segregation.

Figure 12:
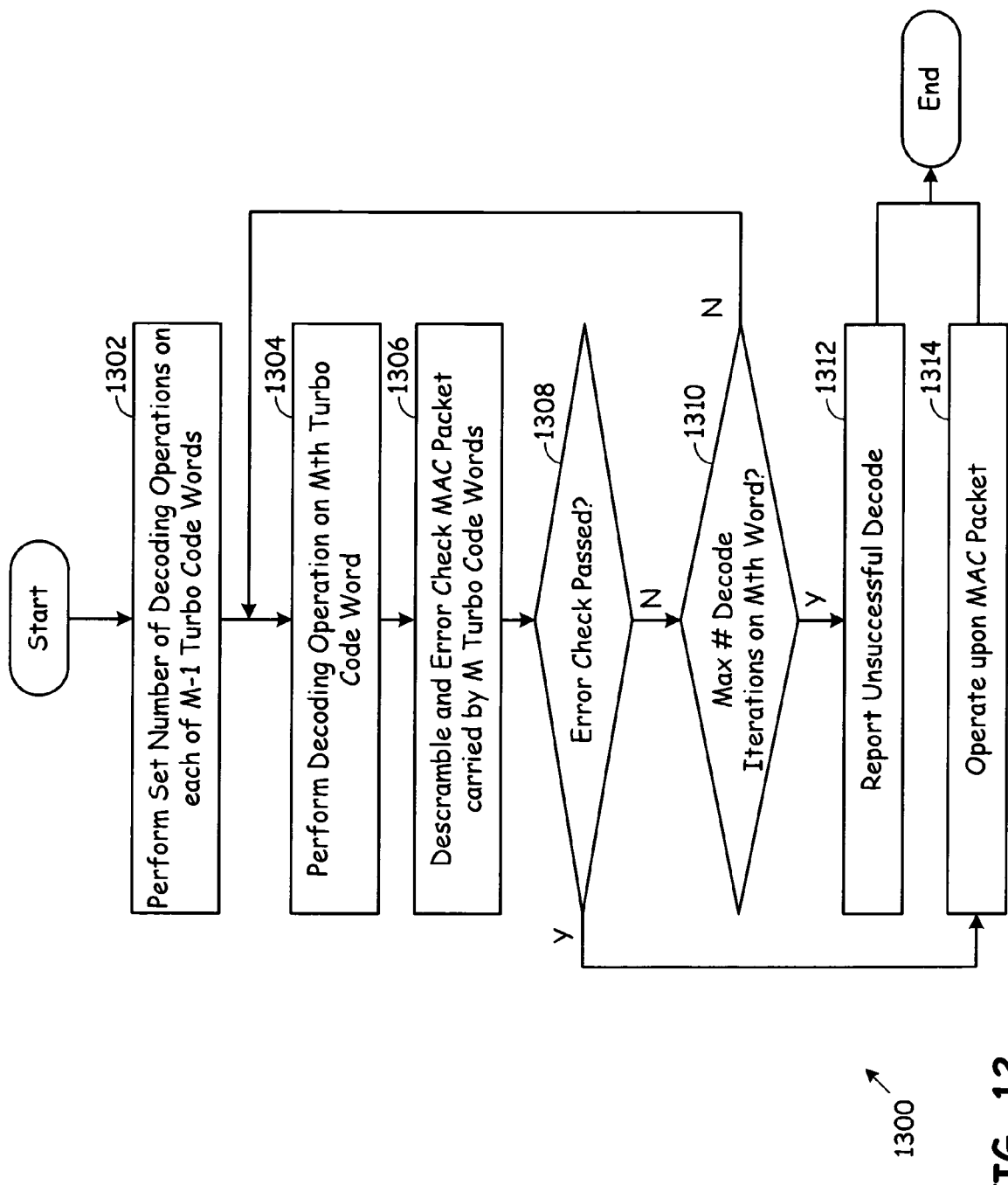
FIG. 12 is a flow chart illustrating operations for decoding multiple turbo code words that jointly carry a MAC packet according to an embodiment of the present invention.

FIG. 12 is a flow chart illustrating operations for decoding one or more turbo code words that carry/carries a MAC packet according to an embodiment of the present invention. According to the general principles of this aspect to the present invention, the turbo decoding module performs a predetermined number of decoding operations on a subject turbo code only when required.

When the MAC packet is carried by multiple turbo code cords, the turbo decoding module may perform different decoding operations on the last turbo code word as compared to the decoding operations for each of the previous turbo code words. When the MAC packet is carried by a single turbo code word, fewer turbo decoding operations than a predetermined number of turbo decoding operations are performed on the turbo code word when the MAC packet is produced error free.

For the situation in which the MAC packet is carried by multiple turbo code words, operations 1300 require performing a predetermined number of decoding operations on each of the first M−1 turbo code words (Step 1302) and one or more decoding operations on the Mth turbo code word (Steps 1304-1310). M may be any integer 2 or greater according to this particular aspect to the present invention. For example, referring to FIGS. 11B and 12, when a MAC packet is formed of three turbo code words 1202, 1204, and 1206, operations of Step 1302 will include performing a set number of turbo decoding operations on both the first turbo code word and the second turbo code word 1204. Then, operation proceeds with the turbo code module performing a first decoding operation on the third turbo code word (Step 1304). Then, the turbo decoding module descrambles and error checks the MAC packet 1216 that is carried by the three (M) turbo code words 1202, 1204, and 1206 (Step 1306). If the error check operations pass (as determined at Step 1308) the turbo decoding module operates upon the MAC packet (Step 1314). However, if the initial turbo decoding operation performed on the third (Mth) turbo code word did not pass the error check operation at Step 1308, operation proceeds to Step 1310 where it is determined whether the third (Mth) turbo code word has been decoded a predetermined number of times. If a predetermined number of decoding iterations on the third (Mth) turbo code word has not been performed, operation returns to Step 1304 where an additional turbo decoding operation on the third (Mth) turbo code word is performed. After the predetermined number of decoding iterations on the third (Mth) turbo code word have been performed, operation proceeds to Step 1312 wherein an unsuccessful decoding is reported.

These teachings of the present invention as illustrated in FIG. 12 may applied to differing numbers of turbo code words forming the MAC packet 1212, as well. For example, when M=2, as illustrated in FIG. 11C, step 1302 is performed on the first turbo code word. Further, when M=1, as illustrated in FIG. 11D, step 1302 is not performed while the remainder of the steps of FIG. 12 are performed on the single turbo code word. The operations 1300 of FIG. 12 therefore yield efficiencies in that a reduced number of decoding operations on one (Mth) turbo code, in many cases of multiple turbo code words that carries the MAC packet. Thus, for example, when the predetermined number of decoding operations is eight (8) decoding operations and a successful decoding requires less than 8 decoding operations, efficiencies including reduced latency and reduced resource usage result.

Figure 13:
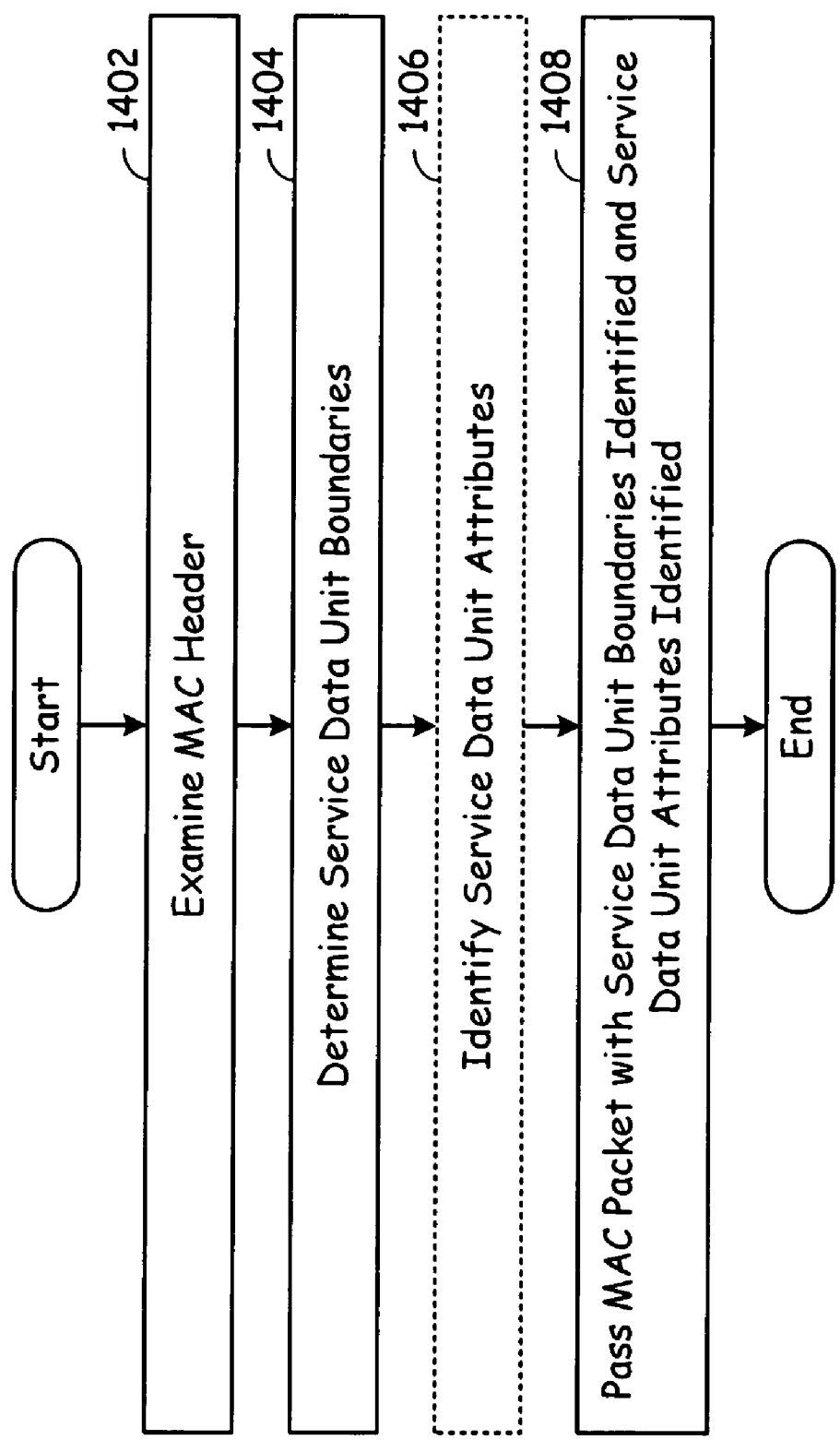
FIG. 13 is a flow chart illustrating operations for extracting information from a MAC packet by a turbo code decoding module according to an embodiment of the present invention.

FIG. 13 is a flow chart illustrating operations for extracting information from a MAC packet by a turbo code decoding module according to an embodiment of the present invention. The structure of the MAC packet in relationship to turbo code words was previously described with reference to FIGS. 11A-11D. The operations of FIG. 13 were described generally at Step 1314 of FIG. 12. These operations commence with the turbo decoding module examining the MAC header 1218 of the MAC packet 1216 (Step 1402). The turbo decoding module then determines the service data unit boundaries of the service data units 1224-1232 of the MAC packet 1216 (Step 1404). Then, the turbo decoding module may identify the service data unit attributes of the service data units 1224-1232 (Step 1406). The turbo decoding module then passes the MAC packet 1216 along with the service data unit boundaries identified in the service data unit attributes identified at Step 1406 (Step 1408). From Step 1408 operation ends.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

The invention claimed is:

1. A baseband processing module for use within a Radio Frequency (RF) transceiver, the baseband processing module comprising:

a downlink/uplink interface operable to receive outbound data from and to provide inbound data to coupled host processing components;

TX processing components communicatively coupled to a RF front end of the RF transceiver and to the downlink/uplink interface and operable to receive the outbound data from the downlink/uplink interface, to process the outbound data to produce a baseband TX signal, and to output the baseband TX signal to the RF front end of the RF transceiver;

a processor;

memory communicatively coupled to the processor, the memory operable to store sets of Incremental Redundancy (IR) samples;

RX processing components communicatively coupled to the processor, to the memory, and to the RF front end and operable to receive a baseband RX signal from the RF front end, to produce a set of IR samples from the baseband RX signal, and to transfer the set of IR samples to the memory; and a turbo decoding module communicatively coupled to the processor, to the memory, and to the downlink/uplink interface, the turbo decoding module operable to receive a set of IR samples from the memory, to form a turbo code word from the set of IR samples, to turbo decode the turbo code word to produce the inbound data, and to output the inbound data to the downlink/uplink interface;

wherein the turbo decoding module is further operable to maintain a set of metrics while turbo decoding the turbo code word, identify a chosen metric of the set of metrics; and normalize each other metric of the set of metrics based upon the chosen metric.

2. The baseband processing module of claim 1, wherein the turbo decoding module is further operable to:

perform at least one initial turbo decoding operation on the turbo code word;

determine whether the MAC packet has been produced error free after the at least one initial turbo decoding operation performed on the turbo code word;

when the at least one initial turbo decoding operation performed on the turbo code word does not produce the MAC packet error free, perform at least one additional turbo decoding operation on the turbo code word; and when the at least one initial turbo decoding operation on the turbo code word produces the MAC packet error free, terminate turbo decoding operations on the turbo code word prior to performing a set number of turbo decoding operations on the turbo code word.

3. The baseband processing module of claim 1, wherein the turbo decoding module is further operable to:

form a first turbo code word from part of a set of IR samples, the first turbo code word corresponding to a first portion of a Media Access Control (MAC) packet;

form a second turbo code word from the rest part of a set of IR samples, the second turbo code word corresponding to a second portion of the MAC packet;

perform a set number of turbo decoding operations on the first turbo code word;

perform at least one initial turbo decoding operation on the second turbo code word;

determine whether the MAC packet has been produced error free after the at least one initial turbo decoding operation performed on the second turbo code word;

when the at least one initial turbo decoding operation performed on the second turbo code word does not produce the MAC packet error free, perform at least one additional turbo decoding operation on the second turbo code word; and when the at least one initial turbo decoding operation on the second turbo code word produces the MAC packet error free, terminate turbo decoding operations on the second turbo code word prior to performing the predetermined number of turbo decoding operations on the second turbo code word.

4. The baseband processing module of claim 3, wherein in determining whether the MAC packet has been produced error free after the at least one initial turbo decoding operation performed on the second turbo code word, the turbo decoding module is operable to check a CRC portion of the MAC packet included in the second portion of the MAC packet.

5. The baseband processing module of claim 1, wherein, upon completion of a successful decoding operation of the turbo code word to produce a Media Access Control (MAC) packet, the turbo decoding module is operable to:

examine a header of the MAC packet;

determine boundaries of Service Data Units (SDUs) carried by the MAC packet; and output the MAC packet along with the boundaries of the SDUs to the downlink/uplink interface.

6. The baseband processing module of claim 1, wherein the turbo decoding module comprises:

a memory interface communicatively coupled to the memory;

a de-rate matching module;

a turbo decoder core;

a descrambling and Cyclical Redundancy Check (CRC) module; and an output buffer.

7. The baseband processing module of claim 6, wherein the de-rate matching module is operable to de-rate match a set of IR samples.

8. The baseband processing module of claim 6, wherein the turbo decoder core comprises:

a plurality of registers operable to store the turbo code word and intermediate results;

a forward main pipe add compare select engine communicatively coupled to at least one of the plurality of registers and operable to perform forward add, compare, and select operations on the turbo code word;

a reverse main pipe add compare select engine communicatively coupled to at least one of the plurality of registers and operable to perform reverse add, compare, and select operations on the turbo code word;

a metrics memory communicatively coupled to the forward main pipe add compare select engine and to the reverse main pipe add compare select engine and operable to store a set of metrics corresponding to corresponding turbo decoding operations; and a log likelihood ratio engine communicatively coupled to the reverse main pipe add compare select engine, to the metric memory, and to the descrambling and CRC module and operable to process results of the forward main pipe add compare select engine and the reverse main pipe add compare select engine to produce a turbo decoded result.

9. The baseband processing module of claim 8, wherein the forward main pipe add compare select engine comprises:

a metric generation and summation block that produces a maximum number of check sums for the turbo code word for each decoding operation; and a metric summation selection block that is operable to perform a plurality of comparisons on the maximum number of check sums produced by the metric generation and summation block, to select a group of check sums from the maximum number of check sums, and to output a selected group of check sums.

10. The baseband processing module of claim 8, wherein the reverse main pipe add compare select engine comprises:

a metric generation and summation block that produces a maximum number of check sums for the turbo code word for each decoding operation; and a metric summation selection block that is operable to perform a plurality of comparisons on the maximum number of check sums produced by the metric generation and summation block, to select a group of check sums from the maximum number of check sums, and to output a selected group of check sums.

11. A method for performing turbo decoding operations in a Radio Frequency (RF) transceiver of a wireless terminal, the method comprising:

receiving an RX RF signal;

convening the RX RF signal to a baseband RX signal;

producing a set of IR samples from the baseband RX signal;

storing the set of IR samples in an Incremental Redundancy (IR) memory;

a turbo decoding module of the RF transceiver:

retrieving a set of IR samples from the IR memory, de-rate matching the set of IR samples to form a turbo code word;

decoding the turbo code word to produce inbound data; and outputting the inbound data;

the turbo decoding module of the RF transceiver further:

maintaining a set of metrics while turbo decoding the turbo code word;

identifying a chosen metric of the set of metrics; and normalizing each other metric of the set of metrics based upon the chosen metric.

12. The method of claim 11, further comprising, upon completion of a successful decoding operation of the turbo code word to produce a Media Access Control (MAC) packet, the turbo decoder:
- examining a header of the MAC packet;
- determining boundaries of Service Data Units (SDUs) carried by the MAC packet; and
- outputting the MAC packet along with the boundaries of the SDUs as the inbound data.

13. A method for performing turbo decoding operations in a Radio Frequency (RF) transceiver of a wireless terminal, the method comprising:
- receiving an RX RF signal;
- convening the RX RF signal to a baseband RX signal;
- producing a set of IR samples from the baseband RX signal;
- storing the set of IR samples in an Incremental Redundancy (IR) memory; and
- a turbo decoding module of the RF transceiver:
- retrieving a set of IR samples from the memory;
- forming a first turbo code word from the part of a set of IR samples, the first turbo code word corresponding to a first portion of a Media Access Control (MAC) packet;
- performing a set number of turbo decoding operations on the first turbo code word;
- forming a second turbo code word from the rest part of a set of IR samples, the second turbo code word corresponding to a second portion of the MAC packet; and
- performing at least one initial turbo decoding operation on the second turbo code word;
- determining whether the MAC packet has been produced error free after the at least one initial turbo decoding operation performed on the second turbo code word;
- when the at least one initial turbo decoding operation performed on the second turbo code word does not produce the MAC packet error free, performing at least one additional turbo decoding operation on the second turbo code word; and
- when the at least one initial turbo decoding operation on the second turbo code word produces the MAC packet error free, terminating turbo decoding operations on the second turbo code word prior to performing the set number of turbo decoding operations on the second turbo code word.

14. The method of claim 13, wherein in determining whether the MAC packet has been produced error free after the at least one initial turbo decoding operation performed on the second turbo code word, the turbo decoding module checks a CRC portion of the MAC packet included in the second portion of the MAC packet.

15. The method of claim 13, further comprising the turbo decoding module of the RF transceiver:
- maintaining a set of metrics while turbo decoding the turbo code word;
- identifying a chosen metric of the set of metrics; and
- normalizing each other metric of the set of metrics based upon the chosen metric.

16. The method of claim 13, further comprising, upon completion of a successful decoding operation of the turbo code word to produce a Media Access Control (MAC) packet, the turbo decoder:
- examining a header of the MAC packet;
- determining boundaries of Service Data Units (SDUs) carried by the MAC packet; and
- outputting the MAC packet along with the boundaries of the SDUs as the inbound data.

* * * * *

UNITED STATES PATENT AND TRADEMARK OFFICE
CERTIFICATE OF CORRECTION

PATENT NO. : 7,684,779 B2
APPLICATION NO. : 11/141478
DATED : March 23, 2010
INVENTOR(S) : Mark David Hahm and Li Fung Chang It is certified that error appears in the above-identified patent and that said Letters Patent is hereby corrected as shown below:

Column 16, line 49, in Claim 11: replace "convening" with --converting--.

Column 17, line 14, in Claim 13: replace "convening" with --converting--.

Signed and Sealed this

Eleventh Day of May, 2010

David J. Kappos
*Director of the United States Patent and Trademark Office*